United States Patent
Huang

(10) Patent No.: US 8,589,470 B2
(45) Date of Patent: Nov. 19, 2013

(54) DOWN CONVERSION FILTER

(75) Inventor: Ming-Feng Huang, Jhubei (TW)

(73) Assignee: Industrial Technology Research Institute, Chutung (TW)

( * ) Notice: Subject to any disclaimer, the term of this patent is extended or adjusted under 35 U.S.C. 154(b) by 1131 days.

(21) Appl. No.: 12/388,502

(22) Filed: Feb. 18, 2009

(65) Prior Publication Data

US 2010/0066465 A1    Mar. 18, 2010

Related U.S. Application Data

(60) Provisional application No. 61/097,942, filed on Sep. 18, 2008.

(51) Int. Cl.
*G06G 7/02* (2006.01)
*H04B 1/26* (2006.01)

(52) U.S. Cl.
USPC .......................................... 708/819; 455/323

(58) Field of Classification Search
USPC ............ 708/819; 455/313–333; 327/551–559
See application file for complete search history.

(56) References Cited

U.S. PATENT DOCUMENTS

| | | | |
|---|---|---|---|
| 6,856,925 B2* | 2/2005 | Muhammad et al. | 702/75 |
| 7,006,813 B2* | 2/2006 | Staszewski et al. | 455/323 |
| 7,295,826 B1* | 11/2007 | Cook et al. | 455/323 |
| 7,327,182 B2 | 2/2008 | Dosho | |
| 7,623,838 B2* | 11/2009 | Staszewski et al. | 455/319 |
| 7,664,811 B2* | 2/2010 | Matsuoka et al. | 708/819 |
| 7,965,135 B2* | 6/2011 | Yoshizawa et al. | 327/554 |
| 2003/0050027 A1* | 3/2003 | Muhammad et al. | 455/257 |
| 2003/0083033 A1* | 5/2003 | Staszewski et al. | 455/323 |
| 2006/0166637 A1* | 7/2006 | Lore et al. | 455/313 |
| 2007/0280297 A1 | 12/2007 | Nakatani et al. | |
| 2008/0088389 A1* | 4/2008 | Iida | 333/167 |
| 2008/0299937 A1* | 12/2008 | Miyano et al. | 455/337 |
| 2009/0015306 A1* | 1/2009 | Yoshizawa et al. | 327/231 |
| 2009/0021297 A1* | 1/2009 | Yoshizawa et al. | 327/554 |
| 2009/0251350 A1* | 10/2009 | Park et al. | 341/172 |
| 2009/0257531 A1* | 10/2009 | Miyano et al. | 375/340 |
| 2009/0270061 A1* | 10/2009 | Hosokawa et al. | 455/323 |
| 2009/0322418 A1* | 12/2009 | Burke | 327/552 |
| 2011/0150138 A1* | 6/2011 | Park et al. | 375/316 |

FOREIGN PATENT DOCUMENTS

JP    2007-189666 A    7/2007
WO    2008/108090 A1    9/2008

OTHER PUBLICATIONS

Ming-Feng Huang; Lai-Fu Chen; "A programmable-bandwidth front-end with clock-interleaving down-conversion filters," IEEE Asian Solid-State Circuits Conference, Nov. 2008, pp. 349-352.*
Yoshizawa et al., Machine Translation of WO 2008/032635, published Mar. 20, 2008.*
Office Action of corresponding TW application, published Apr. 17, 2012.
Darius Jakonis et al., A 2.4-GHz RF Sampling Receiver Front-End in 0.18-um CMOS, IEEE Journal of Solid-State Circuits, vol. 40, No. 6, Jun. 2005, US.

* cited by examiner

*Primary Examiner* — Chat Do
*Assistant Examiner* — Matthew Sandifer
(74) *Attorney, Agent, or Firm* — Wang Law Firm, Inc.; Li K. Wang; Stephen Hsu

(57) ABSTRACT

A down conversion filter with a plurality of sampling capacitor, wherein at least one sampling capacitor is discharged in sampling phases or charge-summing phases of the other sampling capacitors.

18 Claims, 10 Drawing Sheets

US 8,589,470 B2

DOWN CONVERSION FILTER

CROSS REFERENCE TO RELATED APPLICATIONS

This application claims the benefit of U.S. Provisional Application No. 61/097,942, filed Sep. 18, 2008, the entirety of which is incorporated by reference herein.

BACKGROUND OF THE INVENTION

1. Field of the Invention

The present invention relates to down conversion filters.

2. Description of the Related Art

FIG. 1A depicts a conventional down conversion filter with switched-capacitor circuits. FIG. 1B illustrates the waveforms of signals $clk_1$-$clk_N$, which control the switches of FIG. 1A.

Referring to FIG. 1B, the signals $clk_1$-$clk_N$ are periodic signals dependent on the clock pulse width, having non-overlapping and successive duty periods. Each duty period (having a length of $1/f_S$) lasts one clock phase. The signals $clk_1$-$clk_{N-2}$ provide sampling phases that alternatively sample the input signal (at the input terminal IN) in the sampling capacitors $C_1$-$C_{N-2}$. The signal $clk_{N-1}$ provides a charge-summing phase that transfers charges from the sampling capacitors $C_1$-$C_{N-2}$ to the charge-summing capacitor $C_S$. The signal $clk_N$ provides a discharge phase that resets the sampling capacitors $C_1$-$C_{N-2}$ for a good signal-to-noise ratio.

The down conversion filter of FIG. 1A sums out the successively sampled signals every N clock phases. Thus, each output cycle includes N clock phases, and the tap length of the circuit is N. During each output cycle (including N clock phases), one clock phase is reserved for the charge-summing phase, one clock phase is reserved for the discharge phase, and only the rest (N−2) clock phases are reserved for the sampling phases. Because the number of the sampling capacitors is dependent on the number of the available sampling phases and the performance of the down conversion filter is controllable by designing the values of the sampling capacitors, the reserved discharge phase limits the flexibility of the controllable coefficients of the system.

BRIEF SUMMARY OF THE INVENTION

An exemplary embodiment of the invention discloses a down conversion filter comprising an input terminal, an output terminal, a charge-summing capacitor coupled between the output terminal and a common-mode terminal (such as the ground), and a first and a second switched-capacitor circuit.

The first switched-capacitor circuit comprises a first-first sampling capacitor coupled between a first-first node and the common-mode terminal, a first-first charging switch coupled between the input terminal and the first-first node, a first-first discharging switch coupled between the first-first node and the common-mode terminal, a first-second sampling capacitor coupled between a first-second node and the common-mode terminal, a first-second charging switch coupled between the first-first node and the first-second node, a first-second discharging switch coupled between the first-second node and the common-mode terminal; and a first charge-summing switch coupled between the first-second node and the output terminal.

The second switched-capacitor circuit comprises a second sampling capacitor coupled between a second node and the common-mode terminal, a second charging switch coupled between the input terminal and the second node, a second discharging switch coupled between the second node and the common-mode terminal, and a second charge-summing switch coupled between the second node and the output terminal.

Another exemplary embodiment of the invention discloses a down conversion filter comprising an input terminal, an output terminal, a charge-summing capacitor coupled between the output terminal and a common-mode terminal (such as the ground), and a first-first and a first-second switched-capacitor circuit.

The first-first switched-capacitor circuit comprises a first-first sampling capacitor coupled between a first-first node and the common-mode terminal, a first-first charging switch and a first-first enable switch coupled in series between the input terminal and the first-first node, a first-first discharging switch and a first-first reset enable switch coupled in series between the first-first node and the common-mode terminal, and a first-first charge-summing switch and a first-second enable switch coupled in series between the first-first node and the output terminal.

The first-second switched-capacitor circuit comprises a first-second sampling capacitor coupled between a first-second node and the common-mode terminal, a first-second charging switch and a second-first enable switch coupled in series between the input terminal and the first-second node, a first-second discharging switch and a first-second reset enable switch coupled in series between the first-second node and the common-mode terminal, and a first-second charge-summing switch and a second-second enable switch coupled in series between the first-second node and the output terminal.

In this embodiment, the first-first and first-second enable switches and the first-second reset enable switch are controlled by a first enable signal, and the first-first reset enable switch and the second-first and second-second enable switches are controlled by a second enable signal. The first and second enable signals are of opposite states, and alternatively enable the first-first and the first-second switched-capacitor circuits for different output cycles.

Another exemplary embodiment of the invention discloses a down conversion filter comprising an input terminal, an output terminal, a charge-summing capacitor coupled between the output terminal and a common-mode terminal (such as the ground), and a first and a second switched capacitor circuit.

In this embodiment, the first switched-capacitor circuit comprises a plurality of first sampling capacitors, taking turns to be coupled to the input terminal during a first output cycle. The first sampling capacitors are coupled to the output terminal during a predetermined phase of a second output cycle, and are coupled to the common-mode terminal during the second output cycle and after the predetermined phase.

In this embodiment, the second switched-capacitor circuit comprises a plurality of second sampling capacitors, taking turns to be coupled to the input terminal during the second output cycle. The second sampling capacitors are coupled to the output terminal during the predetermined phase of the first output cycle, and are coupled to the common-mode terminal during the first output cycle and after the predetermined phase.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description recites exemplary embodiments carrying out the invention. This description is made for the purpose of illustrating the general principles of the invention and should not be taken in a limiting sense. The scope of the invention is best determined by reference to the appended claims.

Figure 1A:
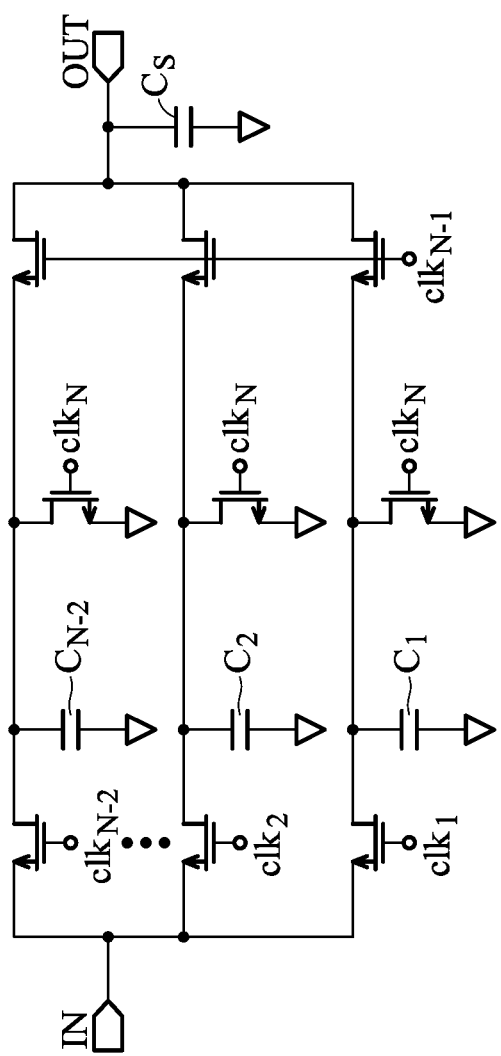
FIG. 1A depicts a conventional down conversion filter with switched-capacitor circuits.
Figure 1B:
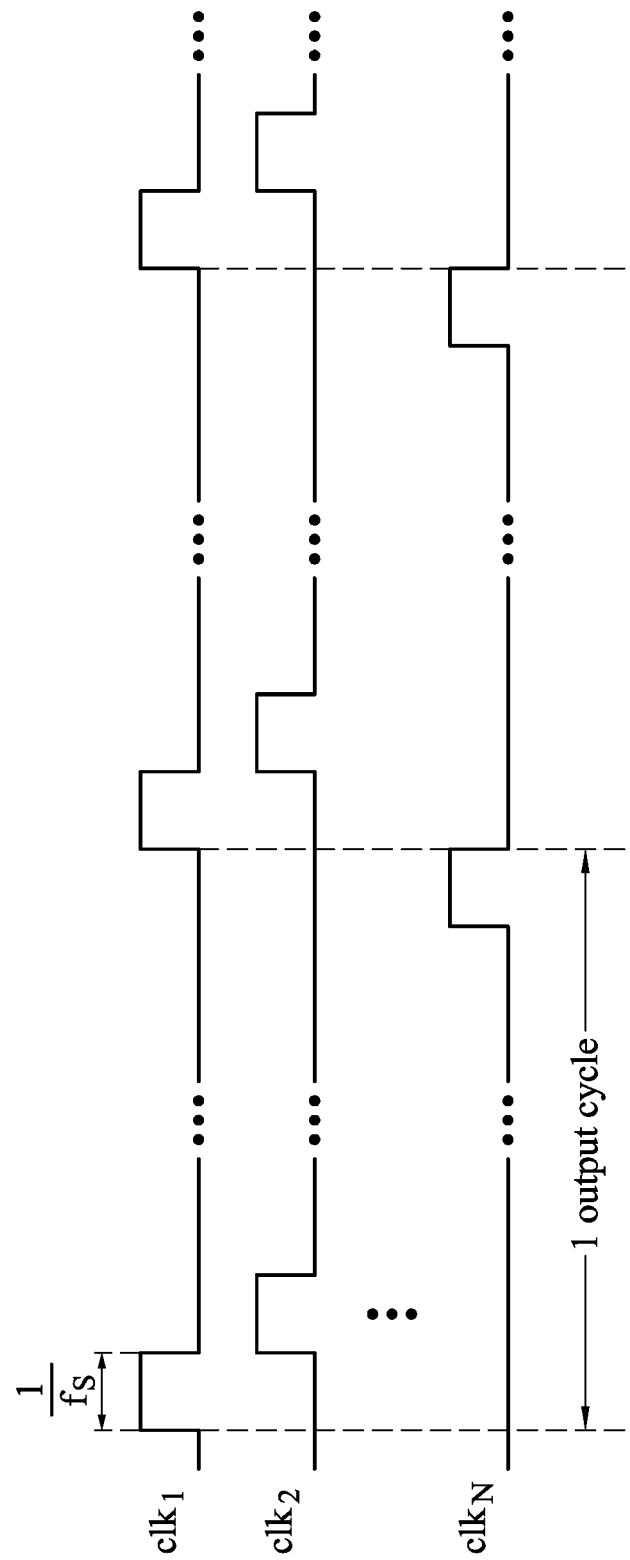
FIG. 1B illustrates the waveforms of signals $clk_1$-$clk_N$, which control the switches of FIG. 1A.
Figure 2A:
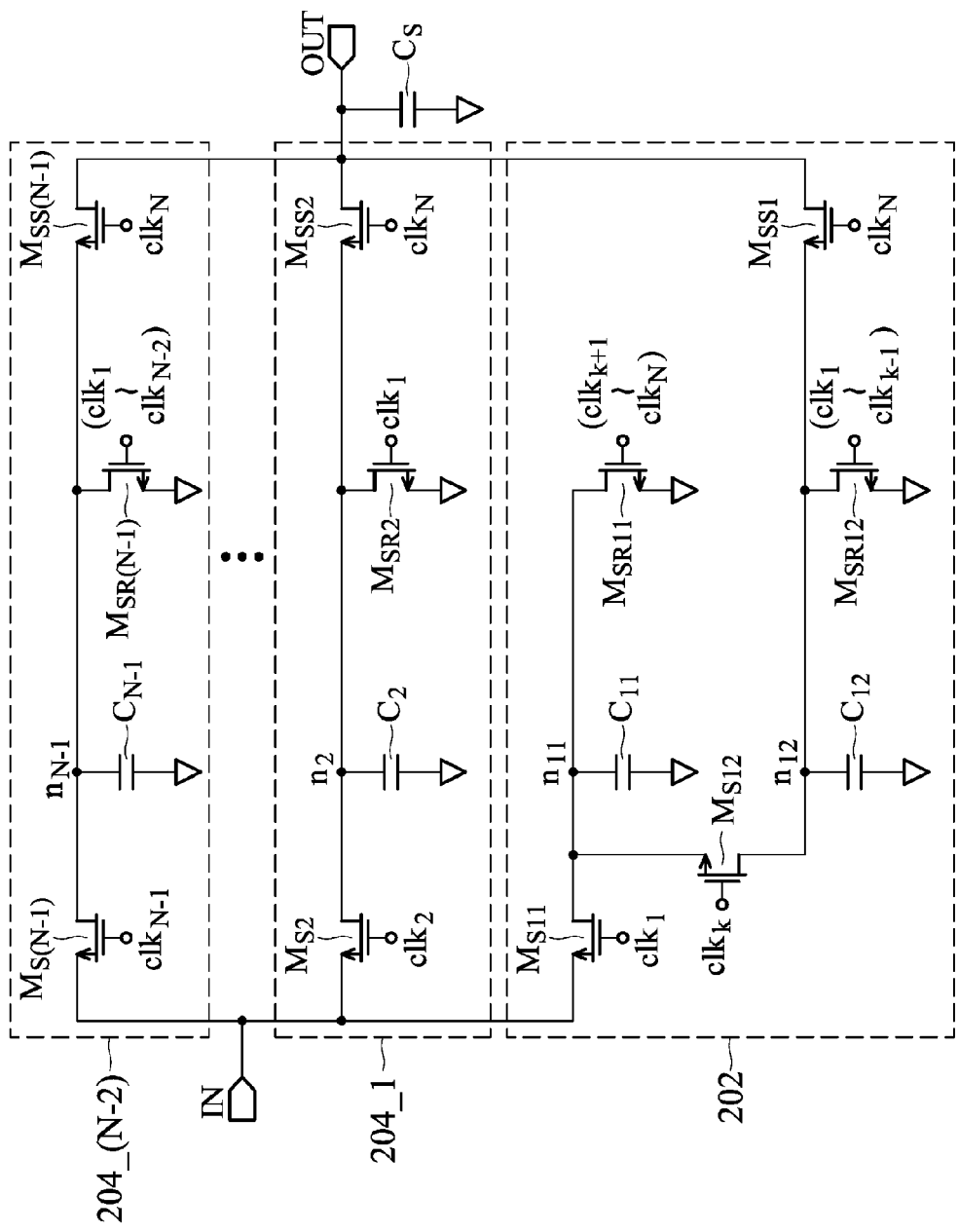
FIG. 2A depicts an exemplary embodiment of the down conversion filter of the invention.

FIG. 2A depicts an exemplary embodiment of the down conversion filter of the invention, comprising an input terminal IN receiving an input signal, an output terminal OUT outputting an output signal, a charge-summing capacitor $C_S$ coupled between the output terminal OUT and ground (or a common-mode terminal biased at a common-mode voltage), and switched-capacitor circuits 202 and 204_1-204_(N−2). The structure of the switched-capacitor circuit 202 is distinct from those of the switched-capacitor circuits 201_1-204_(N−2).

This paragraph describes the structure of the switched-capacitor circuit 202, which comprises sampling capacitors $C_{11}$ and $C_{12}$, charging switches $M_{S11}$ and $M_{S12}$, discharging switches $M_{SR11}$ and $M_{SR12}$, and a charge-summing switch $M_{SS1}$. The sampling capacitor $C_{11}$ is coupled between a first-first node $n_{11}$ and the ground. The charging switch $M_{S11}$ is coupled between the input terminal IN and the first-first node $n_{11}$. The discharging switch $M_{SR11}$ is coupled between the first-first node $n_{11}$ and the ground. The sampling capacitor $C_{12}$ is coupled between a first-second node $n_{12}$ and the ground. The charging switch $M_{S12}$ is coupled between the first-first node $n_{11}$ and the first-second node $n_{12}$. The discharging switch $M_{SR12}$ is coupled between the first-second node $n_{12}$ and the ground. The charge-summing switch $M_{SS1}$ is coupled between the first-second node $n_{12}$ and the output terminal OUT.

This paragraph describes the structure of the switched-capacitor circuit 204_1 ... or 204_(N−2). The following takes the circuit 204_1 for example. The switched capacitor circuit 204_1 comprises a sampling capacitor $C_2$, a charging switch $M_{S2}$, a discharging switch $M_{SR2}$ and a charge-summing switch $M_{SS2}$. The sampling capacitor $C_2$ is coupled between a second node $n_2$ and the ground. The charging switch $M_{S2}$ is coupled between the input terminal IN and the second node $n_2$. The discharging switch $M_{SR2}$ is coupled between the second node $n_2$ and the ground. The charge-summing switch $M_{SS2}$ is coupled between the second node $n_2$ and the output terminal OUT.

Figure 2B:
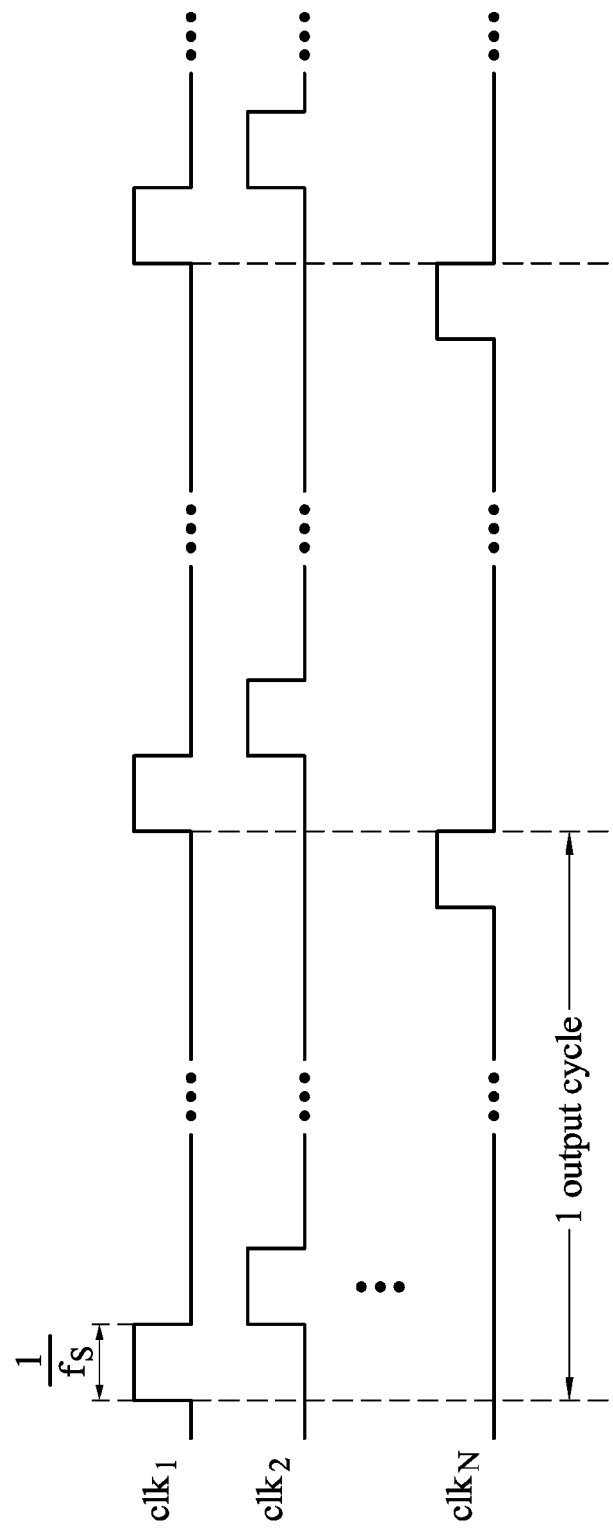
FIG. 2B illustrates the waveforms of signals controlling the switches of FIG. 2A.

The waveforms of the signals $clk_1$-$clk_N$, which control the switches of FIG. 2A, are shown in FIG. 2B. The signals $clk_1$-$clk_N$ are periodic signals dependent on the clock pulse width, having non-overlapping and successive duty periods. Each duty period (having a length of $1/f_S$) may last one clock phase. It has to be noted that the value, $1/f_S$, is controllable and is not limited to the length of one clock phase. In an exemplary embodiments of the invention, the down conversion filter provides controllable bandwidth, wherein the bandwidth is dependent on the design of $1/f_S$.

Signals $clk_1$-$clk_{N-1}$ alternatively turn on the charging switches $M_{S11}$ and $M_{S2}$-$M_{S(N-1)}$ to sample the input signal (on the input terminal IN) in the sampling capacitors $C_{11}$ and $C_2$-$C_{N-1}$. The charging switch $M_{S12}$ is controlled by a signal $clk_k$, which may be $clk_2$, $clk_3$ ... or $clk_{N-1}$, to transfer the charges from the sampling capacitor $C_{11}$ to the sampling capacitor $C_{12}$ before a charge-summing phase of the down conversion filter. Signal $clk_N$ controls the charge-summing switches $M_{SS1}$-$M_{SS(N-1)}$ and provides the charge-summing phase transferring charges from the sampling capacitors $C_{12}$ and $C_2$-$C_{N-1}$ to the charge-summing capacitor $C_S$.

Instead of using a reserved discharge phase, the sampling capacitors $C_2$-$C_{N-1}$ are discharged during the sampling phases of the advanced charged sampling capacitors. For example, the discharging switch $M_{SR2}$ of the sampling capacitor $C_2$ is controlled by a signal $clk_1$ which provides a sampling phase for the sampling capacitor $C_{11}$. Similarly, the discharging switch $M_{SR(N-1)}$ of switched-capacitor circuit 204_(N−2) is controlled according to the same concept. The discharging switch $M_{SR(N-1)}$ may be controlled by any of the signals $clk_1$-$clk_{N-2}$. The sampling capacitor $C_{N-1}$ is discharged during the sampling phase of any of the advanced charged sampling capacitors $C_{11}$ or $C_2$-$C_{N-2}$.

To reset the sampling capacitors $C_{11}$ and $C_{12}$ of the switched-capacitor circuit 202, the control signal of the discharging switch $M_{SR11}$ may lag the signal $clk_k$, and be in phase with or lead the signal $clk_N$. The control signal of the discharging switch $M_{SR12}$ may be in phase with or lag the signal $clk_1$ and lead the signal $clk_{k-1}$.

Compared with conventional techniques with N tap length, the embodiment shown in FIG. 2A provides one more controllable coefficient since the discharging of the sampling capacitors are combined in the sampling phases.

The structure shown in FIG. 2A is not used to limit the scope of the invention. Any down conversion filter with the switched-capacitor circuits 202 and any of the switched-capacitor circuits 204_1-204_(N−2) is within the scope of the invention.

Figure 3A:
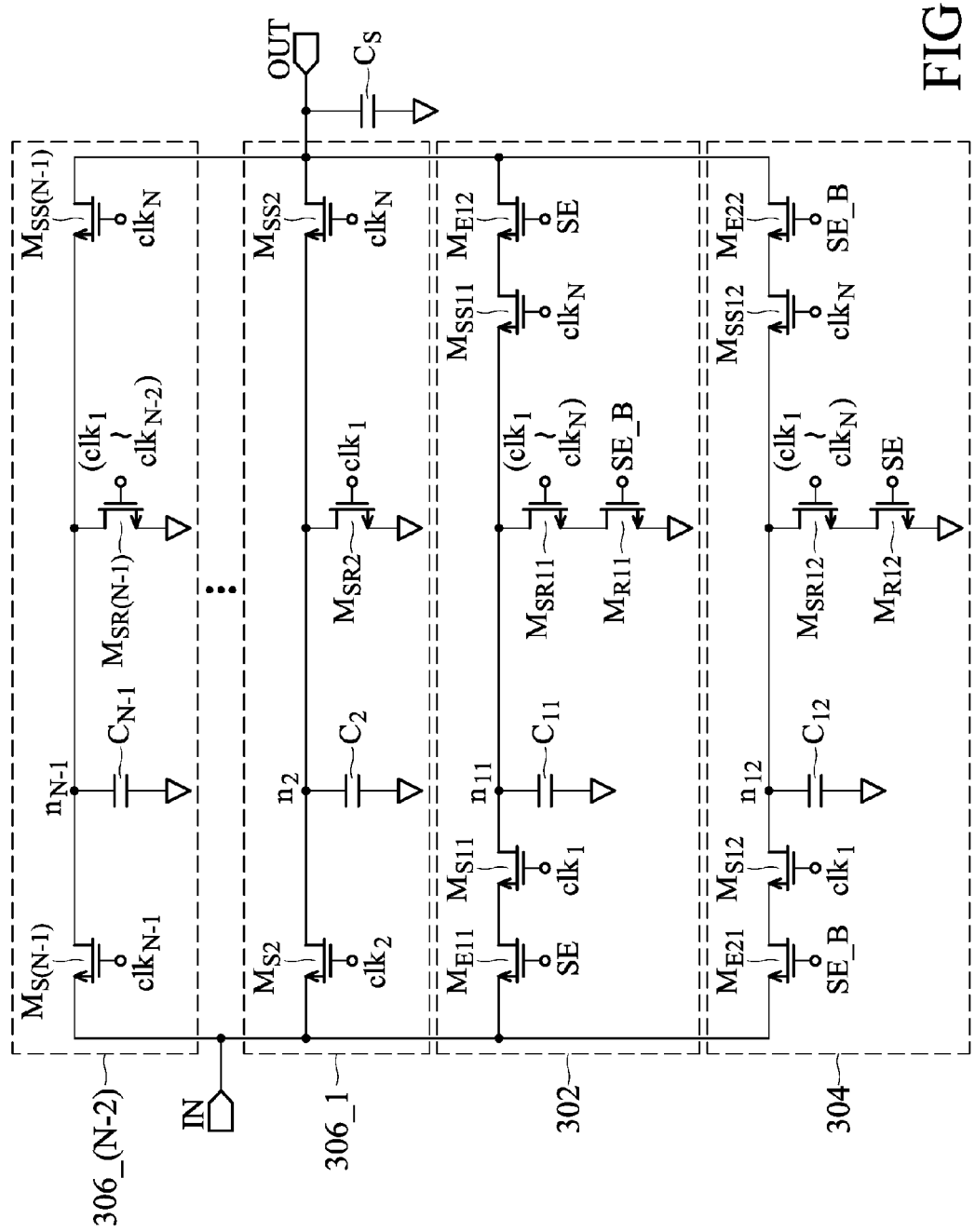
FIG. 3A depicts another exemplary embodiment of the down conversion filter of the invention.

FIG. 3A depicts another exemplary embodiment of the down conversion filter of the invention. The down conversion filter comprises an input terminal IN, an output terminal OUT, a charge-summing capacitor $C_S$ coupled between the output terminal OUT and ground (or a common-mode terminal biased at a common-mode voltage), and switched-capacitor circuits 302, 304 and 306_1-306_(N−2).

This paragraph describes the structure of the switched-capacitor circuit 302, which comprises a sampling capacitor $C_{11}$, a charging switch $M_{S11}$, a discharging switch $M_{SR11}$, a charge-summing switch $M_{SS11}$, a reset enable switch $M_{R11}$, and enable switches $M_{E11}$, and $M_{E12}$. The sampling capacitor $C_{11}$ is coupled between a first-first node $n_{11}$ and the ground. The charging switch $M_{S11}$ and the enable switch $M_{E11}$ are coupled in series between the input terminal IN and the first-first node $n_{11}$. The discharging switch $M_{SR11}$ and the reset enable switch $M_{R11}$ are coupled in series between the first-first node $n_{11}$ and the ground. The charge-summing switch $M_{SS11}$ and the enable switch $M_{E12}$ are coupled in series between the first-first node $n_{11}$ and the output terminal OUT.

This paragraph describes the structure of the switched-capacitor circuit 304, which comprises a sampling capacitor $C_{12}$, a charging switch $M_{S12}$, a discharging switch $M_{SR12}$, a charge-summing switch $M_{SS12}$, a reset enable switch $M_{R12}$, and enable switches $M_{E21}$ and $M_{E22}$. The sampling capacitor $C_{12}$ is coupled between a first-second node $n_{12}$ and the ground. The charging switch $M_{S12}$ and the enable switch $M_{E21}$ are coupled in series between the input terminal IN and the first-second node $n_{12}$. The discharging switch $M_{SR12}$ and the reset enable switch $M_{R12}$ are coupled in series between the first-second node $n_{12}$ and the ground. The charge-summing switch $M_{SS12}$ and the enable switch $M_{E22}$ are coupled in series between the first-second node $n_{12}$ and the output terminal OUT.

This paragraph describes the structure of the switched-capacitor circuit 306_1 ... or 306_(N−2). The following takes the circuit 306_1 for example. Circuit 306_1 comprises a sampling capacitor $C_2$, a charging switch $M_{S2}$, a discharging switch $M_{SR2}$ and a charge-summing switch $M_{SS2}$. The sampling capacitor $C_2$ is coupled between a second node $n_2$ and the ground. The charging switch $M_{S2}$ is coupled between the input terminal IN and the second node $n_2$. The discharging switch $M_{SR2}$ is coupled between the second node $n_2$ and the ground. The charge-summing switch $M_{SS2}$ is coupled between the second node $n_2$ and the output terminal OUT.

Figure 3B:
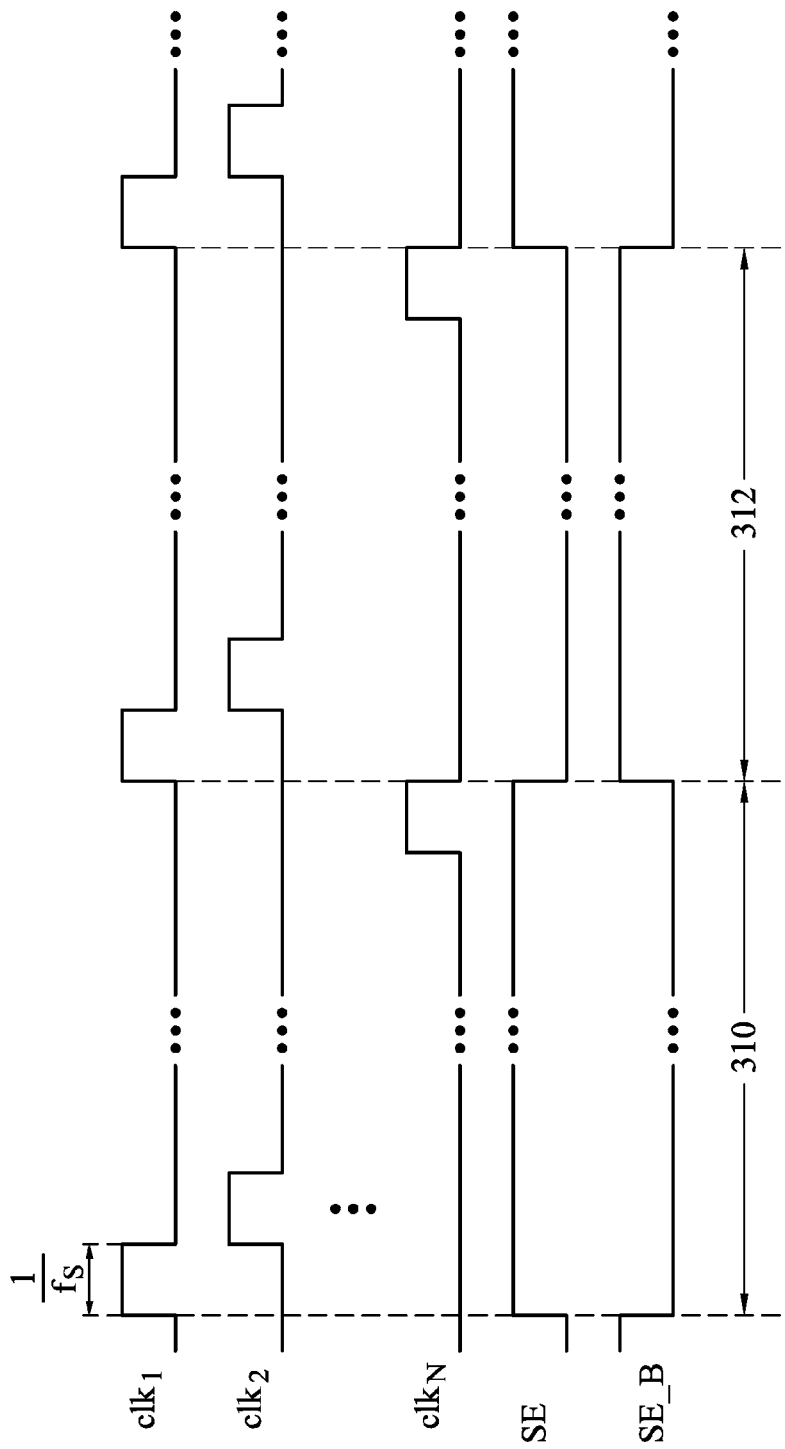
FIG. 3B illustrates the waveforms of signals controlling the switches of FIG. 3A.

The waveforms of the signals controlling the switches of FIG. 3A, are shown in FIG. 3B. The signals $clk_1$-$clk_N$ are periodic signals dependent on the clock signal pulse width, having non-overlapping and successive duty periods. Each duty period (having a length of $1/f_S$) lasts one clock phase. A first and a second enable signal SE and SE_B are shown in FIG. 3B. The enable switches $M_{E11}$ and $M_{E12}$ and the reset enable switch $M_{R12}$ are controlled by the first enable signal SE. The reset enable switch $M_{R11}$ and the enable switches $M_{E21}$ and $M_{E22}$ are controlled by the second enable signal SE_B. The first and second enable signals SE and SE_B are of opposite states, and alternatively enable the switched-capacitor circuits 302 and 304 in different output cycles. The enabled switched-capacitor circuit allows sampling and charge-summing functions and the disabled switched-capacitor circuit allows the discharging function.

Referring to the first output cycle 310 shown in FIG. 3B, wherein the first enable signal SE is active and the second enable signal SE_B is inactive, the switched-capacitor circuit 302 is enabled and the switched-capacitor circuit 304 is disabled. The signals $clk_1$-$clk_{N-1}$ alternatively turn on the charging switches $M_{S11}$ and $M_{S2}$-$M_{S(N-1)}$ to sample the input signal (on the input terminal IN) by the sampling capacitors $C_{11}$ and $C_2$-$C_{N-1}$, and the signal $clk_N$ controls the charge-summing switches $M_{SS11}$ and $M_{SS2}$-$M_{SS(N-1)}$ to transfer charges from the sampling capacitors $C_{11}$ and $C_2$-$C_{N-1}$ to the charge-summing capacitor Cs. The control signal of the discharging switch $M_{SR12}$ may be any of the signals $clk_1$-$clk_N$. The sampling capacitor $C_{12}$ is discharged during the first output cycle 310.

Referring to the second output cycle 312 shown in FIG. 3B, wherein the first enable signal SE is inactive and the second enable signal SE_B is active, the switched-capacitor circuit 302 is disabled and the switched-capacitor circuit 304 is enabled. The signals $clk_1$-$clk_{N-1}$ alternatively turn on the charging switches $M_{S12}$ and $M_{S2}$-$M_{S(N-1)}$ to sample the input signal (on the input terminal IN) by the sampling capacitors $C_{12}$ and $C_2$-$C_{N-1}$, and the signal $clk_N$ controls the charge-summing switches $M_{S12}$ and $M_{S2}$-$M_{S(N-1)}$ to transfer charges from the sampling capacitors $C_{12}$ and $C_2$-$C_{N-1}$ to the charge-summing capacitor Cs. The control signal of the discharging switch $M_{SR11}$ may be any of the signals $clk_1$-$clk_N$. The sampling capacitor $C_{11}$ is discharged during the second output cycle 312.

This paragraph describes the discharge scheme of the sampling capacitors $C_2$-$C_{N-1}$ of FIG. 3A. The sampling capacitors $C_2$-$C_{N-1}$ are discharged during the sampling phases of the advanced charged sampling capacitors. For example, the discharging switch $M_{SR2}$ of the sampling capacitor $C_2$ is controlled by a signal $clk_1$ which provides a sampling phase for the sampling capacitor $C_{11}$ or $C_{12}$. Similarly, the discharging switch $M_{SR(N-1)}$ of the switched-capacitor circuit 306_(N−2) is controlled according to the same concept. The discharging switch $M_{SR(N-1)}$ may be controlled by any of the signals $clk_1$-$clk_{N-2}$. The sampling capacitor $C_{N-1}$ is discharged during the sampling phase of any of the advanced charged sampling capacitors, $C_{11}$ or $C_{12}$ or any of $C_2$-$C_{N-2}$.

Figure 4:
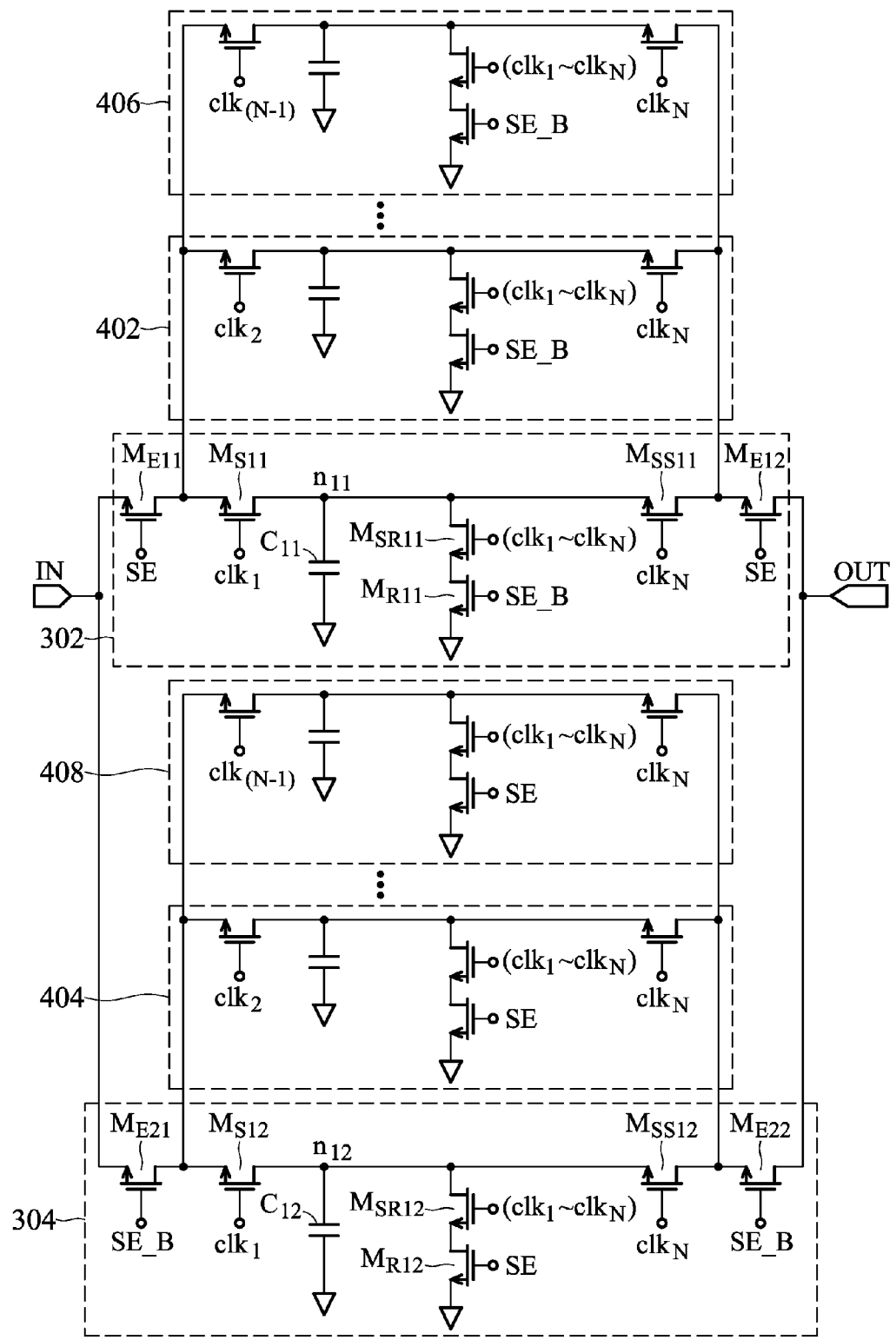
FIG. 4 depicts another exemplary embodiment of the down conversion filter of the invention.

The switched-capacitor circuits cascaded with the switched-capacitor circuits 302 and 304 are not limited to the circuits 306_1-306_(N−2) shown in FIG. 3A. Any down conversion filter with the switched-capacitor circuits 302 and 304 is within the scope of the invention. FIG. 4 shows one example of them.

Referring to FIG. 4, in addition to the switched-capacitor circuits 302 and 304 which are designed for the first sampling phase, the rest of the sampling phases each relate to a pair of switch-capacitor circuits. For example, considering the second sampling phase (determined by the signal $clk_2$), switched-capacitor circuits 402 and 404 can be designed. In the first output cycle (such as the output cycle 310 shown in FIG. 3B), the circuit 402 is enabled to allow the sampling and charge-summing functions while the circuit 404 is disabled to allow the discharging function. In the second output cycle (such as the output cycle 312 shown in FIG. 3B), the circuit 402 is disabled to allow the discharging function while the circuit 404 is enabled to allow the sampling and charge-summing functions. Similarly, switched-capacitor circuits 406 and 408 are designed for the (N−1)th sampling phase (determined by a signal $clk_{N-1}$).

Figure 5:
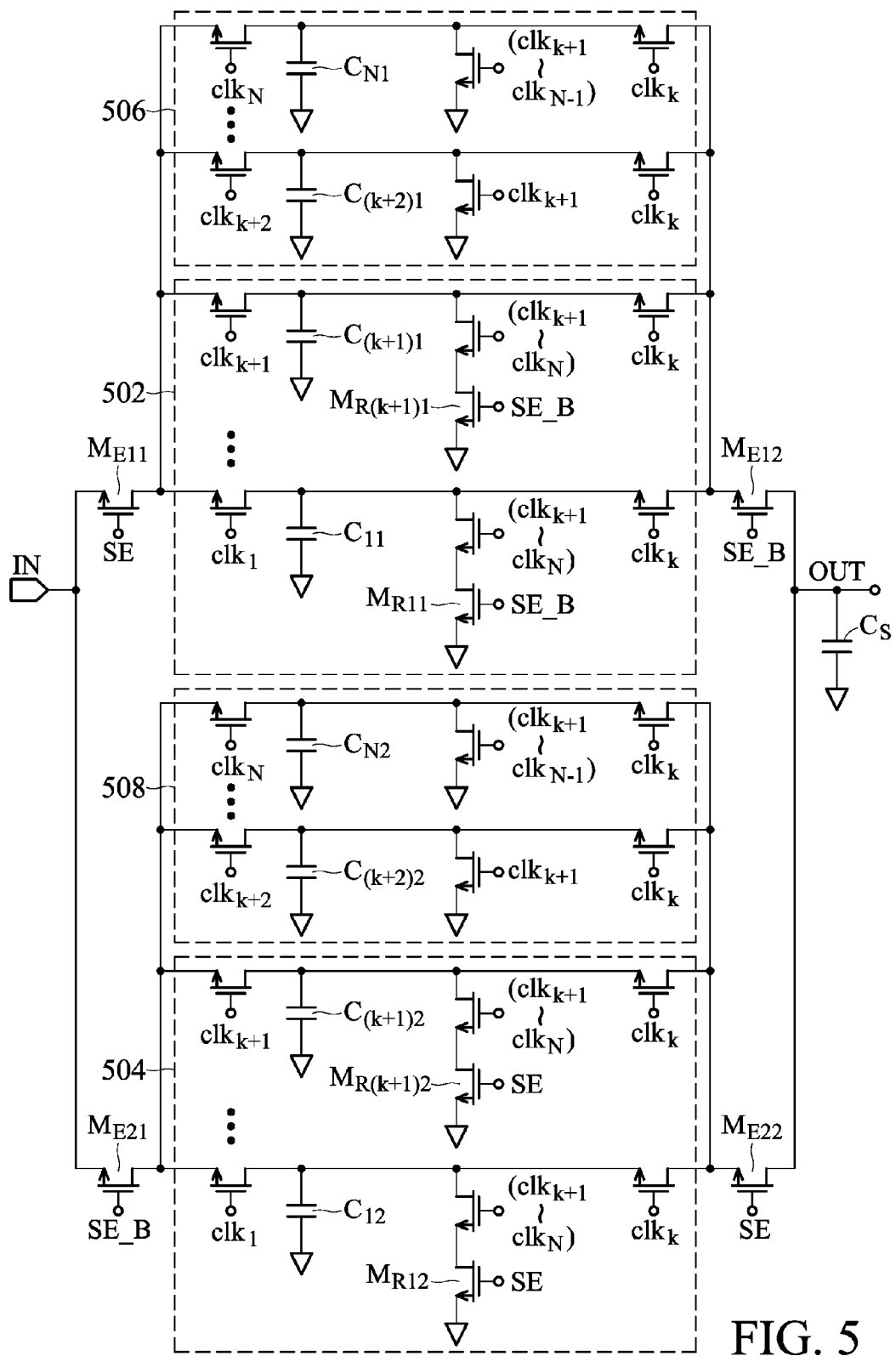
FIG. 5 depicts another exemplary embodiment of the down conversion filter of the invention.

FIG. 5 depicts another exemplary embodiment of down conversion filter of the invention, comprising an input terminal IN, an output terminal OUT, a charge-summing capacitor $C_S$ coupled between the output terminal OUT and ground (or a common-mode terminal biased at a common-mode voltage), enable switches $M_{E11}$, $M_{E12}$, $M_{E21}$ and $M_{E22}$, and switched capacitor circuits 502, 504, 506 and 508. The waveforms of the control signals of the switches are shown in FIG. 3B.

The switched-capacitor circuit 502 comprises a plurality of sampling capacitors $C_{11}$-$C_{(k+1)1}$. The switched-capacitor circuit 504 comprises a plurality of sampling capacitors $C_{12}$-$C_{(k+1)2}$. The switched-capacitor circuit 506 comprises a plurality of sampling capacitors $C_{(k+2)1}$-$C_{N1}$. The switched-capacitor circuit 508 comprises a plurality of sampling capacitors $C_{(k+2)2}$-$C_{N2}$. The control scheme of the enable switches $M_{E11}$, $M_{E12}$, $M_{E21}$ and $M_{E22}$ and the reset enable switches $M_{R11}$-$M_{R(k+1)1}$ and $M_{R12}$-$M_{R(k+1)2}$ not only releases the discharge phase but also the charge-summing phase. In a case with a tap-length of N, the number of controllable coefficients is raised to N. Thus, the flexibility of the down conversion filter is dramatically improved.

This paragraph describes the control schemes of the switches $M_{E11}$, $M_{E12}$, $M_{E21}$, $M_{E22}$ and $M_{R11}$-$M_{R(k+1)1}$ and $M_{R12}$-$M_{R(k+1)2}$. In a first output cycle (output cycle 310 shown in FIG. 3A), the enable switch $M_{E11}$ is turned on to allow sampling functions for the sampling capacitors of the switched-capacitor circuits 502 and 506, and the enable switch $M_{E22}$ and the reset enable switches $M_{R12}$-$M_{R(k+1)2}$ are turned on to allow the charge-summing function and discharging function for the sampling capacitors of the switched-capacitor circuits 504 and 508. In a second output cycle (the output cycle 312 shown in FIG. 3A), the enable switch $M_{E21}$ is turned on to allow the sampling functions for the sampling capacitors of the switched-capacitor circuits 504 and 508, and the enable switch $M_{E12}$ and the reset enable switches $M_{R11}$-$M_{R(k+1)1}$ are turned on to allow the charge-summing and discharging phases for the sampling capacitors of the switched-capacitor circuits 502 and 506.

This paragraph details the charging, discharging and charge-summing functions of the sampling capacitors of FIG. 5. In the first output cycle (the output cycle 310 of FIG. 3B), the signals $clk_1$-$clk_N$ provide N sampling phases to alternatively sample the input signal (at the input terminal IN) by the sampling capacitors $C_{11}$-$C_{N1}$ of the switched-capacitor circuits 502 and 506. The charges of the sampling capacitors $C_{11}$-$C_{N1}$ are transferred to the charge-summing capacitor $C_S$ during a predetermined phase $clk_k$ of a second output cycle (the output cycle 312 of FIG. 3B). The predetermined phase $clk_k$ may be any of the signals $clk_1$-$clk_{N-2}$. After the charge transfer, the sampling capacitors $C_{11}$-$C_{N1}$ are discharged. The sampling capacitors $C_{11}$-$C_{(k+1)1}$ may be discharged during the second output cycle (SE_B is active) and according to any of the signals $clk_{k+1}$-$clk_N$. The sampling capacitors $C_{(k+2)1}$-$C_{N1}$ may be discharged prior to their corresponding sampling phase but later than the predetermined phase (determined by the signal $clk_k$). The control scheme of the switches of the switched-capacitor circuits 504 and 508 is similar to that for the circuits 502 and 506.

Figure 6:
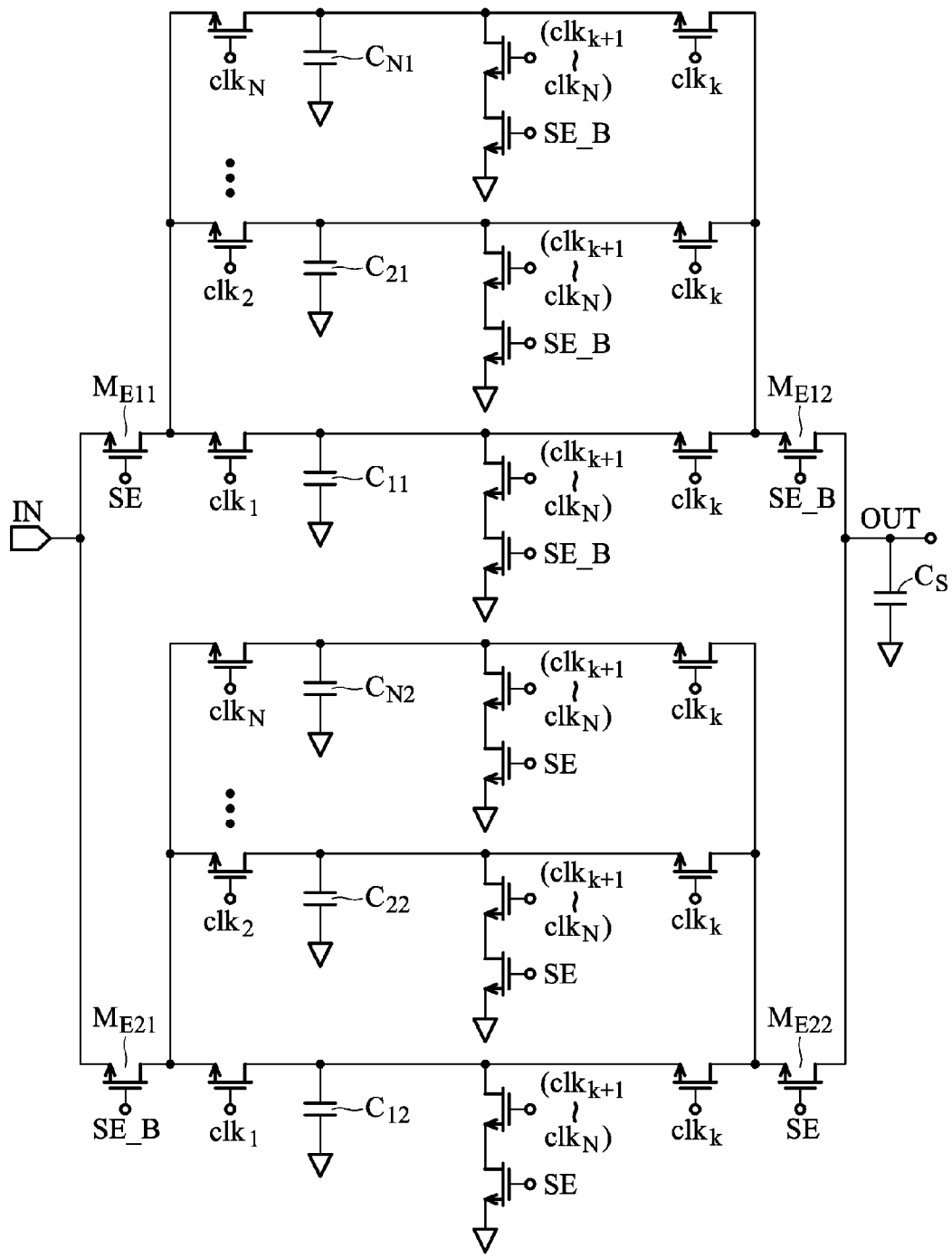
FIG. 6 depicts another exemplary embodiment of the down conversion filter of the invention.

The structure shown in FIG. 5 is not used to limit the scope of the invention. In FIG. 6, the circuits 502 and 504 of FIG. 5 are applied in all sampling phases. It is noted that the predetermined phase $clk_k$ of FIG. 6 may be determined to be any of the signals $clk_1$-$clk_{N-1}$.

Figure 7:
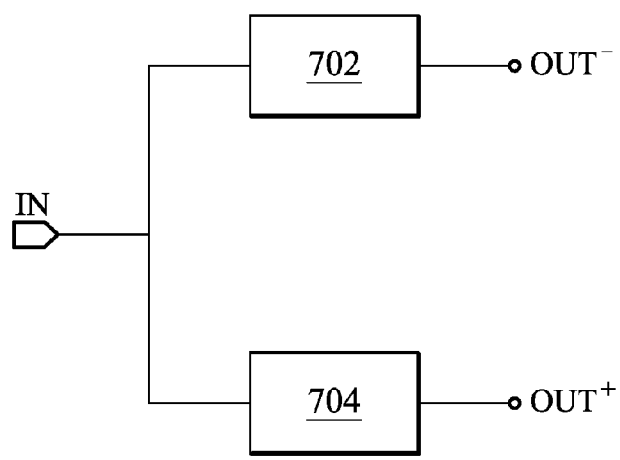
FIG. 7 depicts another exemplary embodiment of the down conversion filter of the invention.

FIG. 7 depicts another exemplary embodiment of the down conversion filter of the invention, wherein blocks 702 and 704 may be separately realized by any of the aforementioned down conversion filters (of FIGS. 2A, 3A and 4-6). The output of the block 702 is OUT⁻, and the output of the block 704 is OUT⁺. The sampling capacitors of the block 702 provide negative controllable coefficients for the overall transfer function of the circuit of FIG. 7, and the sampling capacitors of the block 704 provide positive ones.

It is noted that the waveforms shown in FIGS. 2B and 3B do not intend to limit the scope of the invention. They just show exemplary embodiments of the control scheme of the circuits disclosed in the invention.

The aforementioned circuits may be designed by a specific layout, wherein the sampling capacitors, that are successively charged, may be disposed successively according to their control signals, so that the power consumption is dramatically suppressed.

Furthermore, the aforementioned circuits may be realized in a FIR form (wherein the charge-summing capacitor $C_S$ is discharged during each output cycle) or in an IIR form (wherein the charge-summing capacitor $C_S$ is not discharged during each output cycle).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A down conversion filter, comprising:
   an input terminal;
   an output terminal;
   a charge-summing capacitor coupled between the output terminal and a common-mode terminal biased at a common-mode voltage;
   a first switched-capacitor circuit, comprising:
      a first-first sampling capacitor coupled between a first-first node and the common-mode terminal;
      a first-first charging switch coupled between the input terminal and the first-first node;
      a first-first discharging switch coupled between the first-first node and the common-mode terminal;
      a first-second sampling capacitor coupled between a first-second node and the common-mode terminal;
      a first-second charging switch coupled between the first-first node and the first-second node, wherein the first-second charging switch is turned on for charge sharing between the first-first sampling capacitor and the first-second sampling capacitor;
      a first-second discharging switch coupled between the first-second node and the common-mode terminal, wherein the first-second discharging switch is turned on in a phase different from a turned-on phase of the first-first discharging switch; and
      a first charge-summing switch coupled between the first-second node and the output terminal for charge sharing between the first-second sampling capacitor and capacitors at the output terminal; and
   a second switched-capacitor circuit, comprising:
      a second sampling capacitor coupled between a second node and the common-mode terminal;
      a second charging switch coupled between the input terminal and the second node;
      a second discharging switch coupled between the second node and the common-mode terminal; and
      a second charge-summing switch coupled between the second node and the output terminal.

2. The down conversion filter as claimed in claim 1, wherein the first-first charging switch is controlled by a first control signal, the second charging switch is controlled by a second control signal, and the first and second charge-summing switches are controlled by a third control signal, wherein the first, second and third control signals are periodic signals and have non-overlapped duty periods, and the first control signal leads the second control signal and the second control signal leads the third control signal.

3. The down conversion filter as claimed in claim 2, wherein the second discharging switch is controlled by a fourth control signal, and the fourth control signal is a periodic signal, the first, second and fourth control signals have non-overlapped duty periods, and the fourth control signal leads the second control signal and is in phase with or lags the first control signal.

4. The down conversion filter as claimed in claim 3, wherein the first-second charging switch is controlled by a fifth control signal, and the fifth control signal is a periodic signal, the first, the third and the fifth control signals have non-overlapped duty periods, and the first control signal leads the fifth control signal and the fifth control signal leads the third control signal.

5. The down conversion filter as claimed in claim 4, wherein the first-first discharging switch is controlled by a sixth control signal, and the sixth control signal is a periodic signal, the third, fifth and sixth control signals have non-overlapped duty periods, and the fifth control signal leads the sixth control signal and the sixth control signal leads or is in phase with the third control signal.

6. The down conversion filter as claimed in claim 5, wherein the first-second discharging switch is controlled by a seventh control signal, and the seventh control signal is a periodic signal, the first, fifth and seventh control signals have non overlapped duty periods, and the first control signal leads or is in phase with the seventh control signal and the seventh control signal leads the fifth control signal.

7. The down conversion filter as claimed in claim 6, wherein lengths of the duty periods of the first, second, third, fourth, fifth, sixth and seventh control signals are controllable.

8. A down conversion filter, comprising:
an input terminal;
an output terminal;
a charge-summing capacitor coupled between the output terminal and a common-mode terminal biased at a common-mode voltage;
a first-first switched-capacitor circuit, comprising:
  a first-first sampling capacitor coupled between a first-first node and the common-mode terminal;
  a first-first charging switch and a first-first enable switch, coupled in series between the input terminal and the first-first node;
  a first-first discharging switch and a first-first reset enable switch, coupled in series between the first-first node and the common-mode terminal; and
  a first-first charge-summing switch and a first-second enable switch, coupled in series between the first-first node and the output terminal; and
a first-second switched-capacitor circuit, comprising:
  a first-second sampling capacitor coupled between a first-second node and the common-mode terminal;
  a first-second charging switch and a second-first enable switch, coupled in series between the input terminal and the first-second node;
  a first-second discharging switch and a first-second reset enable switch, coupled in series between the first-second node and the common-mode terminal; and
  a first-second charge-summing switch and a second-second enable switch, coupled in series between the first-second node and the output terminal,
wherein the first-first and first-second enable switches and the first-second reset enable switch are controlled by a first enable signal,
wherein the first-first reset enable switch and the second-first and second-second enable switches are controlled by a second enable signal, and
wherein the first and second enable signals are of opposite states, and alternatively enable the first-first and the first-second switched-capacitor circuits for different output cycles.

9. The down conversion filter as claimed in claim 8, further comprising a second switched-capacitor comprising:
a second sampling capacitor coupled between a second node and the common-mode terminal;
a second charging switch coupled between the input terminal and the second node;
a second discharging switch coupled between the second node and the common-mode terminal; and
a second charge-summing switch coupled between the second node and the output terminal.

10. The down conversion filter as claimed in claim 9, wherein the first-first and first-second charging switches are controlled by a first control signal, the second charging switch is controlled by a second control signal, and the first-first, first-second and second charge-summing switches are controlled by a third control signal, and the first, second and third control signals are periodic signals and have non-overlapped duty periods, the first control signal leads the second control signal and the second control signal leads the third control signal.

11. The down conversion filter as claimed in claim 10, wherein the second discharging switch is controlled by a fourth control signal, and the fourth control signal is a periodic signal, the first, second and fourth control signals have non-overlapped duty periods, and the fourth control signal leads the second control signal and is in phase with or lags the first control signal.

12. The down conversion filter as claimed in claim 11, wherein lengths of the duty periods of the first, second, third and fourth control signals are controllable.

13. A down conversion filter, comprising:
an input terminal;
an output terminal;
a charge-summing capacitor coupled between the output terminal and a common-mode terminal biased at a common-mode voltage;
a first switched-capacitor circuit, comprising:
  a plurality of first sampling capacitors, taking turns to be coupled to the input terminal during a first output cycle,
  wherein the first sampling capacitors are coupled to the output terminal during a predetermined phase of a second output cycle, and are coupled to the common-mode terminal during the second output cycle and after the predetermined phase; and
a second switched-capacitor circuit, comprising:
  a plurality of second sampling capacitors, taking turns to be coupled to the input terminal during the second output cycle,
  wherein the second sampling capacitors are coupled to the output terminal during the predetermined phase of the first output cycle, and are coupled to the common-mode terminal during the first output cycle and after the predetermined phase;
wherein the first switched-capacitor circuit further comprises a first-first enable switch and a plurality of first charging switches, the first-first enable switch is turned on during the first output cycle to couple the input terminal to first terminals of the plurality of first charging switches, and second terminals of the plurality of first charging switches are coupled to the first sampling capacitors, respectively, and the plurality of first charging switches are alternatively turned on;
wherein the first switched-capacitor circuit further comprises a plurality of first charge-summing switches and a first-second enable switch, the plurality of first charge-summing switches corresponding to the plurality of first sampling capacitors are turned on during the predetermined phase of the first and second output cycles both to couple the plurality of first sampling capacitors to a first terminal of the first-second enable switch, and, a second terminal of the first-second enable switch is coupled to the output terminal and the first-second enable switch is turned on during the second output cycle;
wherein the second switched-capacitor circuit further comprises a second-first enable switch and a plurality of second charging switches, the second-first enable switch is turned on during the second output cycle to couple the input terminal to first terminals of the plurality of second charging switches, and second terminals of the plurality of second charging switches are coupled to the second sampling capacitors, respectively, and the plurality of second charging switches are alternatively turned on;

wherein the second switched-capacitor circuit further comprises a plurality of second charge-summing switches and a second-second enable switch, the plurality of second charge-summing switches corresponding to the plurality of second sampling capacitors are turned on during the predetermined phase of the first and second output cycles both to couple the plurality of second sampling capacitors to a first terminal of the second-second enable switch, and, a second terminal of the second-second enable switch is coupled to the output terminal and the second-second enable switch is turned on during the first output cycle;

wherein control signals controlling the plurality of first charging switches and the plurality of first charge-summing switches are shared by the second switched-capacitor circuit as control signals controlling the plurality of second charging switches and the plurality of second charge-summing switches.

14. The down conversion filter as claimed in claim 13, wherein control signals controlling coupling between the first sampling capacitors, the input terminal, the output terminal and the common-mode terminal have length-controllable duty periods.

15. The down conversion filter as claimed in claim 13, wherein control signals controlling coupling between the second sampling capacitors, the input terminal, the output terminal and the common-mode terminal have length-controllable duty periods.

16. The down conversion filter as claimed in claim 13, further comprising:

a third switched-capacitor circuit, comprising:
a third sampling capacitor, coupled to the input terminal during the first output cycle and later than the first sampling capacitors,
wherein the third sampling capacitor is coupled to the output terminal during the predetermined phase of the second output cycle, and is coupled to the common-mode terminal after the predetermined phase of the first or second output cycle and before being coupled to the input terminal; and a fourth switched-capacitor circuit, comprising:
a fourth sampling capacitor, coupled to the input terminal during the second output cycle and later than the second sampling capacitors,
wherein the fourth sampling capacitor is coupled to the output terminal during the predetermined phase of the first output cycle, and is coupled to the common-mode terminal after the predetermined phase of the first or second output cycle and before being coupled to the input terminal.

17. The down conversion filter as claimed in claim 16, wherein control signals controlling coupling between the third sampling capacitors, the input terminal, the output terminal and the common-mode terminal have length-controllable duty periods.

18. The down conversion filter as claimed in claim 16, wherein control signals controlling coupling between the fourth sampling capacitors, the input terminal, the output terminal and the common-mode terminal have length-controllable duty periods.

\* \* \* \* \*